(12) United States Patent
Yoo et al.

(10) Patent No.: US 6,603,686 B2
(45) Date of Patent: Aug. 5, 2003

(54) SEMICONDUCTOR MEMORY DEVICE HAVING DIFFERENT DATA RATES IN READ OPERATION AND WRITE OPERATION

(75) Inventors: Chang-sik Yoo, Suwon (KR); Tae-sung Jung, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/246,744

(22) Filed: Sep. 19, 2002

(65) Prior Publication Data

US 2003/0021164 A1 Jan. 30, 2003

Related U.S. Application Data

(62) Division of application No. 09/930,973, filed on Aug. 17, 2001, now Pat. No. 6,477,110.

(30) Foreign Application Priority Data

Mar. 9, 2001 (KR) ......................................... 2001-12246

(51) Int. Cl.$^7$ ................................................. G11C 7/00
(52) U.S. Cl. ....................... 365/193; 365/233; 365/191; 365/189.02
(58) Field of Search ............................... 365/193, 233, 365/191, 189.04

(56) References Cited

U.S. PATENT DOCUMENTS

| 5,572,468 | A | | 11/1996 | Ishinabe et al. ....... 365/189.05 |
| 5,844,858 | A | | 12/1998 | Kyung .................. 365/230.01 |
| 6,088,829 | A | * | 7/2000 | Umemura et al. .......... 714/798 |
| 6,397,312 | B1 | * | 5/2002 | Nakano et al. ............. 711/167 |
| 6,466,491 | B2 | * | 10/2002 | Yanagawa ................... 365/194 |

* cited by examiner

*Primary Examiner*—Richard Elms
*Assistant Examiner*—Toan Le
(74) *Attorney, Agent, or Firm*—Lee & Sterba, P.C.

(57) ABSTRACT

A semiconductor memory device and a system using the semiconductor memory device can perform a data sampling operation safely without a phase synchronization device such as delay locked loop (DLL) or phase locked loop (PLL), wherein the semiconductor memory device incorporates a strobe signal, which is synchronized with a data signal, both traversing similar-length paths between a memory device and a memory controller. In a read operation, the semiconductor memory device generates a first strobe signal synchronized with a read data signal, whereby a read data signal is outputted at both a rising and a falling edge of a strobe signal. In a write operation, a second strobe signal is generated whereby only a single edge is used to generate a write data signal, thereby allowing sufficient time for a data sampling operation to occur and thus operating at half the speed of a read operation.

6 Claims, 6 Drawing Sheets

SEMICONDUCTOR MEMORY DEVICE HAVING DIFFERENT DATA RATES IN READ OPERATION AND WRITE OPERATION

This is a division of application Ser. No. 09/930,973 filed Aug. 17, 2001 now U.S. Pat. No. 6,477,110.

BACKGROUND OF THE INVENTION

1. Field of the Invention

The present invention relates to semiconductor memory devices and systems using the semiconductor memory devices. More particularly, the present invention relates to a semiconductor memory device, system, and a method for using a semiconductor memory device having different data rates for a memory read and a memory write operation.

2. Description of the Related Art

In a system using a memory device, the memory device receives a write data signal transferred from a memory controller in a write operation. Alternatively, the memory controller receives a read data signal outputted from the memory device in a read operation.

The memory controller needs a sampling signal synchronized with the read data signal to perform a data sampling operation for the read data outputted from the memory device in the read operation. Hence, generally, the memory device outputs the read data signal synchronized with a system clock, and the memory controller performs the data sampling operation by using the system clock as the sampling signal. Alternatively, the memory device in the read operation generates a separate strobe signal and outputs the strobe signal together with the read data signal, and the memory controller performs the data sampling operation using the strobe signal as the sampling signal.

In a case where the memory device generates the separate strobe signal in a read operation, the memory device can be configured such that the read data signal and the strobe signal are either synchronized with the system clock or set to have a predetermined phase difference to the system clock. To synchronize the read data signal and the strobe signal with the system clock, a phase synchronization device such as delay locked loop (DLL) or phase locked loop (PLL) is typically used. An exemplary memory device having such a phase synchronization device is a double data rate (DDR) synchronous dynamic random access memory (SDRAM).

However, even with such synchronization, phase differences during the read data operation can still occur due to different path lengths in the coupling between the memory controller and the memory device and in the buffering stages in the two devices. Similar loss of synchronization can occur during a write data operation.

Explaining in greater detail, one strobe signal (or system clock) per eight-bits of data is generally transferred to the memory device in a write operation, a strobe signal (or system clock) input buffer receives and buffers the strobe signal (or system clock), and eight data input buffers receive and buffer the eight-bits of data. Next, eight data sampling circuits simultaneously perform a data sampling operation for the buffered eight-bits of data in response to the buffered strobe signal (or the buffered system clock) simultaneously. The output of each data input buffer is connected to the input of each data sampling circuit, respectively, and the output of the strobe signal (or system clock) input buffer is connected to the control inputs of the eight data sampling circuits. Further, the loading of the output of the strobe signal (or system clock) input buffer may be much larger than that of each data input buffer, thereby changing the time that the strobe signal (or system clock) is delayed Due to the time difference of the delays, even if the write data and the strobe signal (or system clock) inputted to the memory device are externally synchronized with each other, loss of synchronization between the buffered write data by the data input buffer and the buffered strobe signal (or the buffered system clock) by the strobe signal (or system clock) input buffer can occur, and data set-up and hold characteristics may be significantly degraded. This phenomenon gets worse with increased data transfer speeds, that is, when bit-time is reduced.

Hence, the memory device used for high speed input data sampling operations typically uses DLL or PLL to solve the above synchronization problems by generating a compensated internal strobe signal (or internal clock) to perform the data sampling operations. Disadvantageously, incorporation of synchronization devices such as DLL or PLL in the memory device, contributes to design complexity, increased chip area, and yield deterioration.

SUMMARY OF THE INVENTION

It is therefore a feature of an embodiment of the present invention to provide a semiconductor memory device that can perform a data sampling operation safely in a write operation without a phase synchronization device such as DLL or PLL.

It is another feature of an embodiment of the present invention to provide a method for controlling data input/output of a semiconductor memory device that can perform a data sampling operation safely in a write operation without the phase synchronization device such as DLL or PLL.

It is another feature of an embodiment of the present invention to provide a system in which a semiconductor memory device can perform a data sampling operation safely in write operation without a phase synchronization device such as DLL or PLL.

According to an aspect of an embodiment of the present invention, a semiconductor memory device is provided which includes an output section generating a first strobe signal synchronized with a read data signal in a read operation, and outputting the read data signal at a rising edge and a falling edge of the first strobe signal, and an input section receiving a write data signal at either a rising edge or a falling edge of a second strobe signal generated in a memory controller or a system clock in a write operation.

According to a preferred embodiment of the present invention, the first strobe signal is generated through the same path as the output path of the read data.

The memory controller performs a data sampling operation on the read data signal using the first strobe signal in the read operation. Also, the memory controller transfers the write data to the semiconductor memory device in synchronization with the system clock or the second strobe signal in the write operation.

According to another aspect of an embodiment of the present invention, a method for controlling data input/output of a semiconductor memory device includes generating a first strobe signal synchronized with a read data signal in a read operation, and outputting the read data signal at both a rising edge and a falling edge of the first strobe signal, and receiving a write data signal at either a rising edge or a falling edge of a second strobe signal generated in a memory controller or a system clock in a write operation.

According to another feature of an embodiment of the present invention, a system includes a semiconductor memory device operating in response to a system clock, and a memory controller operating in response to the system clock, controlling the semiconductor memory device, and exchanging data with the semiconductor memory device, wherein a data rate of a write data signal transferred to the semiconductor memory device from the memory controller in a write operation is different from a data rate of a read data signal transferred to the memory controller from the semiconductor memory device in a read operation.

According to a preferred embodiment of the present invention, the data rate of the write data signal is half of the data rate of the read data signal.

According to a preferred embodiment of the present invention, the semiconductor memory device includes an output section generating a first strobe signal synchronized with the read data signal in the read operation and outputting the read data signal at a rising edge and a falling edge of the first strobe signal respectively, and an input section receiving the write data signal at either a rising edge or a falling edge of a second strobe signal generated in the memory controller or the system clock in the write operation.

According to a preferred embodiment of the present invention, the first strobe signal is generated through the same path as an output path of the read data signal.

The memory controller performs a data sampling operation for the read data signal using the first strobe signal in the read operation. Also, the memory controller transfers the write data signal to the semiconductor memory device in synchronization with a system clock signal or the second strobe signal in the write operation.

These and other features of the present invention will be readily apparent to those of ordinary skill in the art upon review of the detailed description that follows.

DETAILED DESCRIPTION OF THE PREFERRED EMBODIMENTS

Korean Patent Application No. 2001-12246 filed on Mar. 9, 2001, and entitled "Semiconductor Memory Device Having Different Data Rates In Read Operation And Write Operation," is incorporated herein by reference in its entirety.

The present invention will now be described more fully hereinafter with reference to the accompanying drawings, in which preferred embodiments of the present invention are shown. Like numbers refer to like elements throughout.

Figure 1:
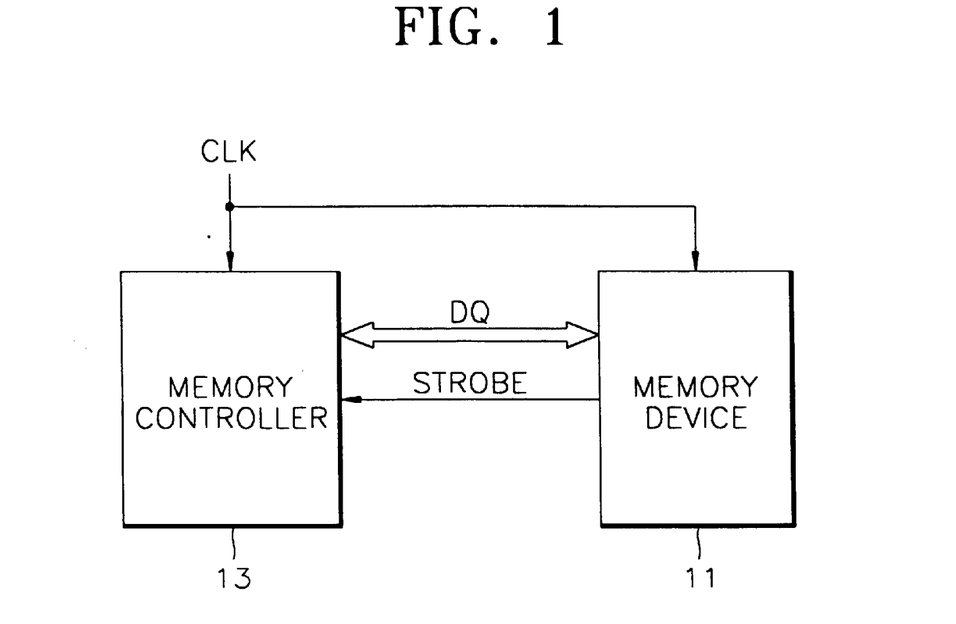
FIG. 1 illustrates a schematic diagram of a system using a semiconductor memory device having a unidirectional strobe signal according to a preferred embodiment of the present invention.

FIG. 1 illustrates a schematic diagram of a system using a semiconductor memory device having a uni-directional strobe signal according to a preferred embodiment of the present invention. In a data read operation, a memory device 11 internally generates a strobe signal (STROBE), which, when synchronized with a read data signal (DQ), is transferred along with DQ via a same length data path to memory controller 13. Specifically, memory device 11 outputs a separate DQ on both a rising edge and a falling edge of STROBE, and memory controller 13 performs data sampling operations on DQ using both of the transitions of STROBE.

Since memory device 11 does not have a phase synchronization device, such as a delay locked loop (DLL) or a phase locked loop (PLL), DQ is not synchronized with a system clock signal (CLK). However, since the memory device 11 sends STROBE, which is synchronized with DQ, to memory controller 13, memory controller 13 can safely perform a data sampling operation for DQ using STROBE.

Since STROBE is generated through the same path as an output path of DQ, even with variations in processing, power supply voltages, and temperature, synchronization between DQ and STROBE can be maintained. Therefore, data transfer rates (i.e. speed) can be increased without degradation in the combination of memory device 11 and memory controller 13.

Figure 2:
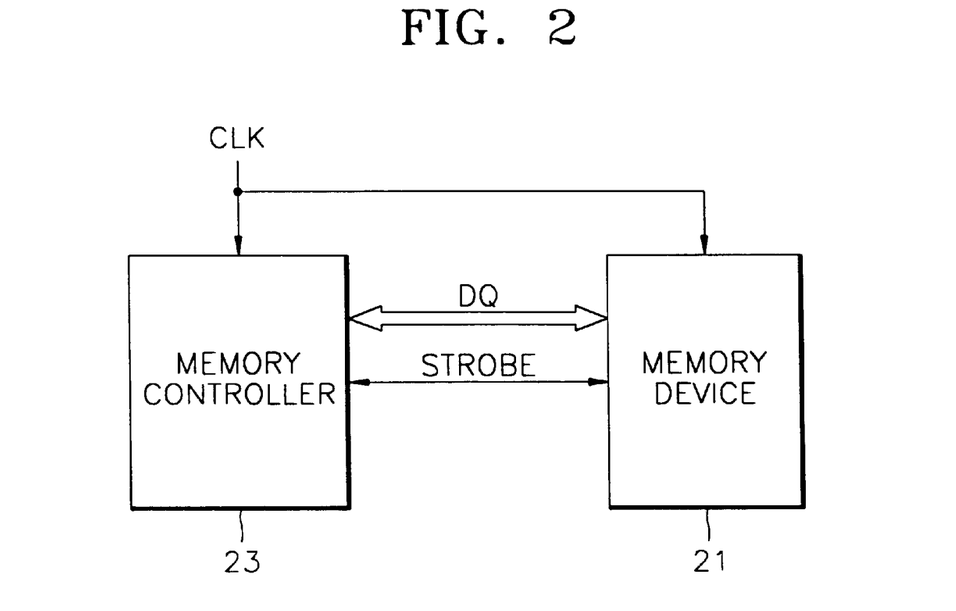
FIG. 2 illustrates a schematic diagram of a system using a semiconductor memory device having a bi-directional strobe signal according to a preferred embodiment of the present invention.

FIG. 2 illustrates a schematic diagram of a system using a semiconductor memory device having a bi-directional strobe signal according to an alternate embodiment of the present invention. The data read operation of the elements of FIG. 2 are identical to the operations of FIG. 1, except that the source device for the synchronized combination of DQ and STROBE can be from either memory controller 23 or memory device 21. For example, in data transfers under control of memory controller 23, STROBE is internally generated in memory controller 23, and transferred to memory device 21 where DQ is synchronized to STROBE as before. Alternatively, in data transfers under control of memory device 21, STROBE is internally generated and synchronized with DQ in memory device 21 as in FIG. 1. In both data read examples, the synchronized data sampling occurs in memory controller 23.

Hence, memory devices (11 of FIG. 1 and 21 of FIG. 2) according to the present invention utilize a double data rate (DDR) method whereby DQ is outputted at a rate of two per each cycle of STROBE in a read operation, specifically on both rising and falling edges of STROBE.

Figure 3:
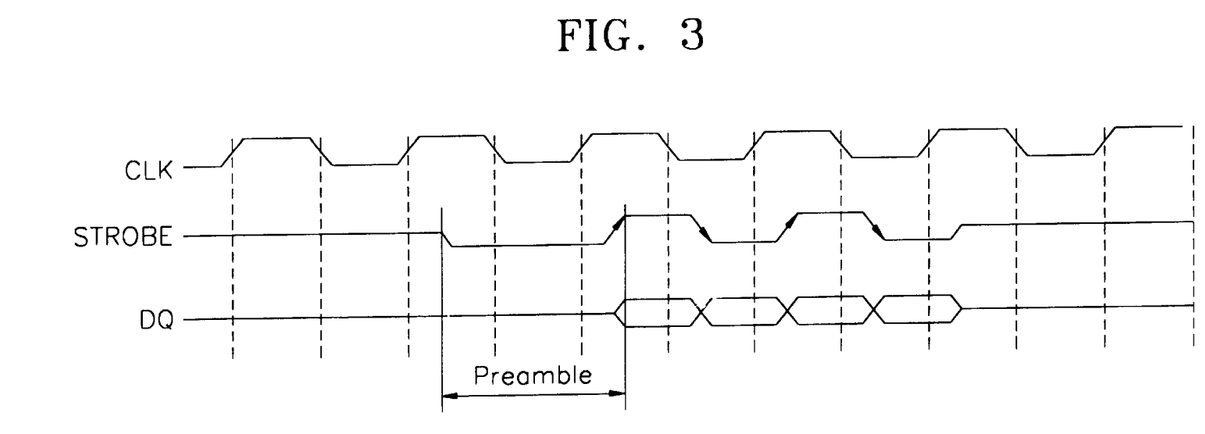
FIG. 3 and FIG. 4 illustrate read timing diagrams of the semiconductor memory devices shown in FIG. 1 and FIG. 2.
Figure 4:
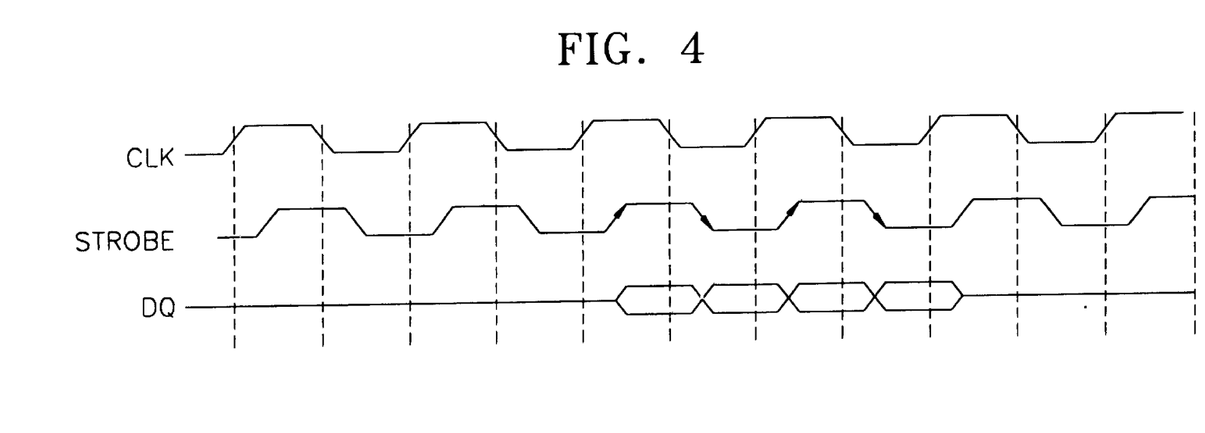

FIG. 3 and FIG. 4 illustrate read timing diagrams of the memory devices (11 of FIG. 1 and 21 of FIG. 2) according to the embodiments of the present invention shown in FIG. 1 and FIG. 2. In the timing diagrams, an exemplary four read operations using DQ occur during a burst read operation.

STROBE pulses can be initiated from a quiescent tri-state condition using a preamble signal period before a DQ sequence as shown in FIG. 3, or the pulses can be free-running as shown in FIG. 4. For the free-running case of FIG. 4, an additional signal may be required to indicate that a DQ sequence is impending. For both FIG. 3 and FIG. 4, STROBE is generated through a same length path as DQ to insure that synchronization between DQ and STROBE can be maintained.

In a write operation according to the preferred embodiment of FIG. 1, memory controller 13 originates and transfers a write data signal (write DQ) to memory device 11 in synchronization with the system clock signal (CLK). Memory device 11 receives write DQ at a next rising transition of CLK. That is, the memory device 11 utilizes a single data rate (SDR) method such that a write DQ is inputted once per each CLK cycle in a write operation.

Similarly, in a write operation for the embodiment of FIG. 2, memory controller 23 generates STROBE, and transfers the write DO and STROBE synchronized with write DO to memory device 21. Specifically, memory device 21 receives write DO at a rising edge of STROBE, and memory device 21, according to the present invention, utilizes the SDR method such that a write DO is inputted once per each cycle of STROBE in a write operation. The particular edge transition selected for the SDR operation in the above discussion was exemplary only and can be either a rising or a falling edge.

Since memory devices (11 of FIG. 1 and 21 of FIG. 2) utilize the SDR method in a write operation according to an embodiment of the present invention, the time available for a write DO is longer, and it is possible to perform secure data sampling operation during the write DO. Thus, memory devices (11 of FIG. 1 and 21 of FIG. 2) can also safely perform the data sampling operation for the write DO without the phase synchronization device such as DLL or PLL.

As explained above, the embodiments of the present invention eliminate the need for a separate phase synchronization device such as DLL or PLL by using a controlled strobe signal (STROBE) in read and write operations. To insure accurate data transfers, these embodiments use a different data rate for a read operation and a write operation, i.e., a data rate of a write operation is reduced to half of the data rate of a read operation.

Figure 5:
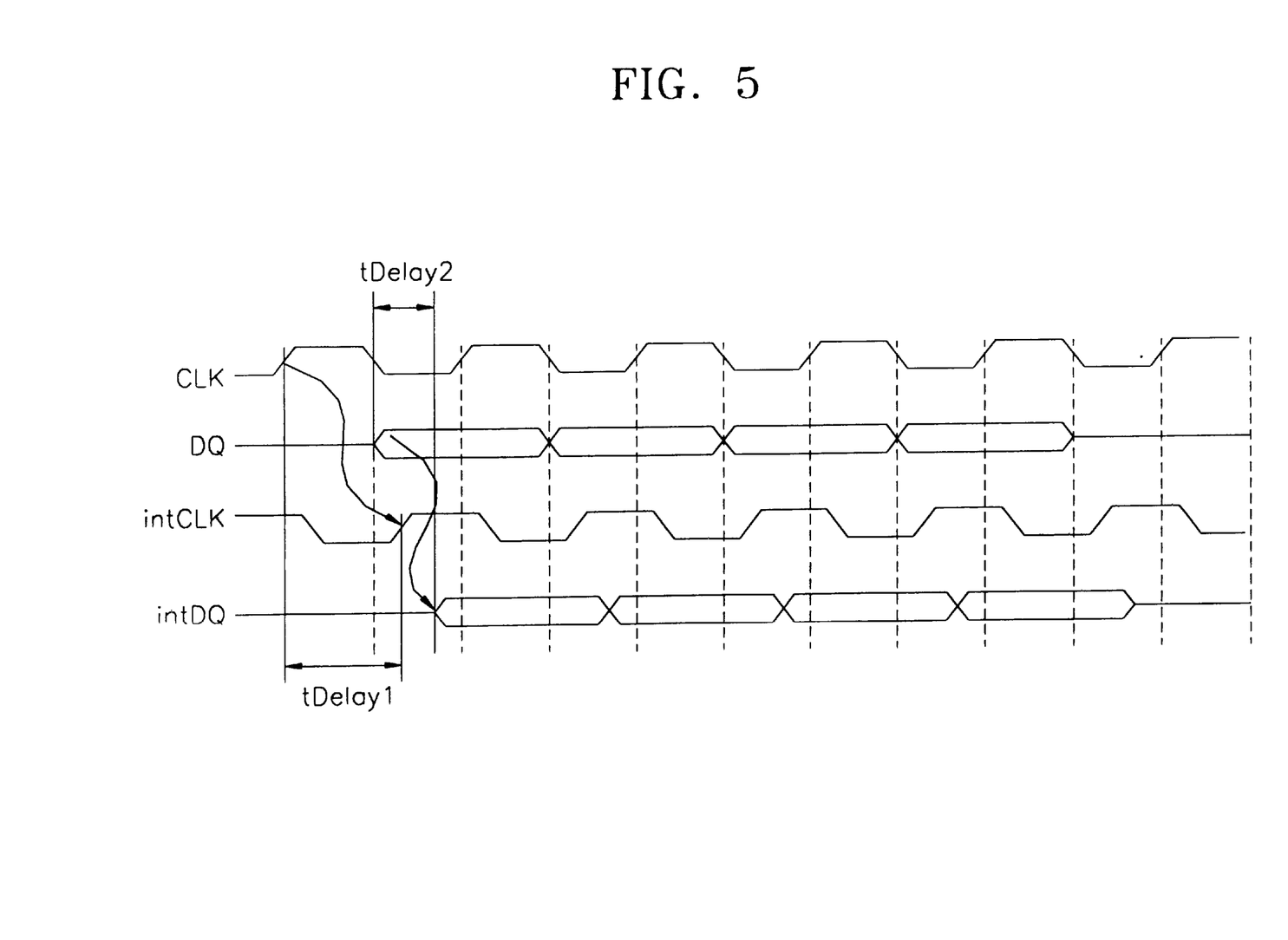
FIG. 5 illustrates a write timing diagram of the semiconductor memory device shown in FIG. 1.
Figure 6:
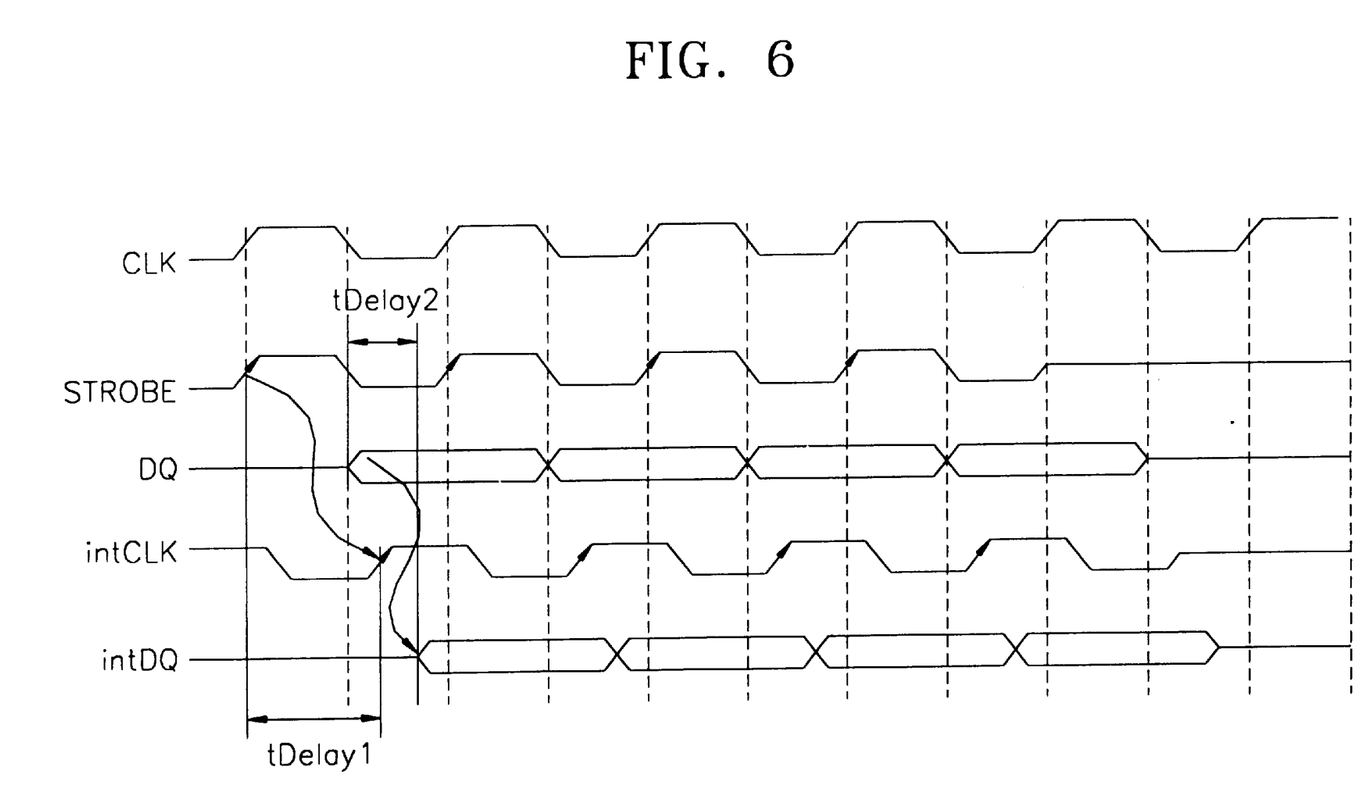
FIG. 6 illustrates a write timing diagram of the semiconductor memory device shown in FIG. 2.

FIG. 5 illustrates a write timing diagram of memory device 11 of FIG. 1, and FIG. 6 illustrates a write timing diagram of memory device 21 of FIG. 2. In FIG. 5, a signal (intCLK) indicates a buffered system clock signal (CLK) through a clock input buffer of memory device 11, and in FIG. 6, a signal (intSTROBE) indicates a buffered strobe signal (STROBE) through a strobe signal input buffer of the memory device 21. A signal (intDQ) in FIG. 5 and FIG. 6 indicates a buffered signal of write DQ through a data input buffer of memory devices (11 of FIG. 1 and 21 of FIG. 2)

Figure 7:
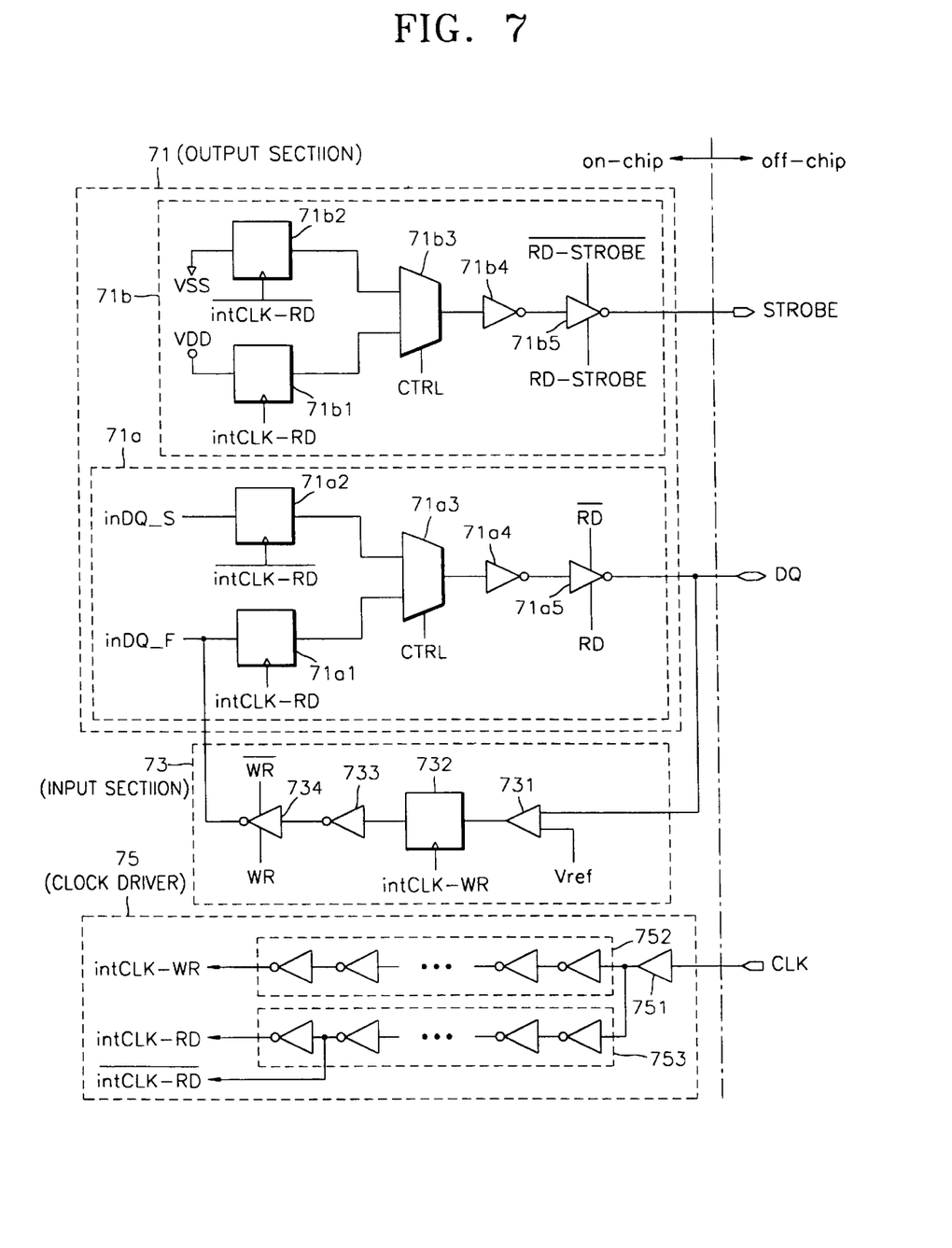
FIG. 7 illustrates a circuit diagram of an input/output circuit of the semiconductor memory device shown in FIG. 1.

FIG. 7 illustrates a circuit diagram of an input/output circuit of memory device 11 of FIG. 1 and includes an output section 71, an input section 73, and a clock driver 75. The output section 71 generates the STROBE synchronized with the read data signal in a read operation, and outputs a read data signal at both a rising edge and a falling edge of STROBE through an input/output pin (DQ), respectively. Input section 73 receives the write data signal at either a rising edge or a falling edge of CLK through pin DQ in a write operation. Clock driver 75 buffers CLK and generates a first internal clock (intCLK-WR) for a write operation and a second internal clock (intCLK-RD) for a read operation.

The configuration and operation of each element will now be described in detail. The output section 71 includes a read data output section 71a and a strobe signal generator 71b. Read data output section 71a includes latches 71a1 and 71a2, a multiplexer 71a3, an inverter 71a4, and a tri-state inverting buffer 71a5.

Latch 71a1 stores odd-numbered internal read data signals (inDQ-F) in response to intCLK-RD, i.e., the rising edge of the intCLK-RD, and latch 71a2 stores even-numbered internal read data signals (inDQ-S) in response to an inverted clock ($\overline{\text{intCLK-RD}}$) of intCLK-RD, i.e., the falling edges of intCLK-RD. Multiplexer 71a3 selects one of the output signals of latches 71a1 and 71a2 in response to a control signal (CTRL). Inverter 71a4 inverts the selected output signal of multiplexer 71a3, which is again inverted and buffered by tri-state inverting buffer 71a5. The resulting data signal is outputted through the input/output pin (DQ) in response to a read control signal (RD).

Strobe signal generator 71b is configured similarly to the read data output section 71a in order to synchronize STROBE with the read data outputted through the input/output pin (DQ). Strobe signal generator 71b includes latches 71b1 and 71b2, a multiplexer 71b3, an inverter 71b4, and a tri-state inverting buffer 71b5.

Latch 71b1 stores a power voltage (VDD) as logic high state in response to intCLK-RD, i.e., the rising edges of the second internal clock intCLK-RD. Latch 71b2 stores a ground voltage (VSS) as logic low state in response to an inverted clock $\overline{\text{intCLK-RD}}$ of intCLK-RD, i.e., the falling edges of intCLK-RD. Multiplexer 71b3 selects one of the output signals of latches 71b1 and 71b2 in response to a control signal (CTRL). Inverter 71b4 inverts the output signal of multiplexer 71b3, and tri-state inverting buffer 71b5 inverts and buffers the output signal of 71b4. The resulting data signal is outputted externally as STROBE in response to a strobe control signal (RD-STROBE). As explained above, since STROBE is generated through the same path as an output path of the read data signal, STROBE and the read data signal as outputted through the input/output pin (DQ) are synchronized with each other.

Input section 73 includes an input buffer 731, a latch 732, an inverter 733, and a tri-state inverting buffer 734. Input buffer 731 buffers the write data signal inputted through the input/output pin (DQ) relative to a reference voltage (Vref). Latch 732 stores the output signal of the input buffer 731 in response to the first internal clock (intCLK-WR), i.e., either rising or falling edges of the first internal clock (intCLK-WR). Inverter 733 inverts the output signal of latch 732, and tri-state inverting buffer 734 inverts and buffers the output signal of 733, and outputs it internally in response to a write control signal (WR).

Clock driver 75 includes a clock buffer 751, a first internal clock driver 752, and a second internal clock driver 753. Clock buffer 751 buffers the system clock (CLK) inputted externally. First internal clock driver 752 is comprised of an even number of serially-connected inverters, and generates intCLK-WR in response to an output signal of clock buffer 751. Second internal clock driver 753 is comprised of an even number of serially-connected inverters, and generates the second internal clock (intCLK-RD) in response to the output signal of the clock buffer 751.

Figure 8:
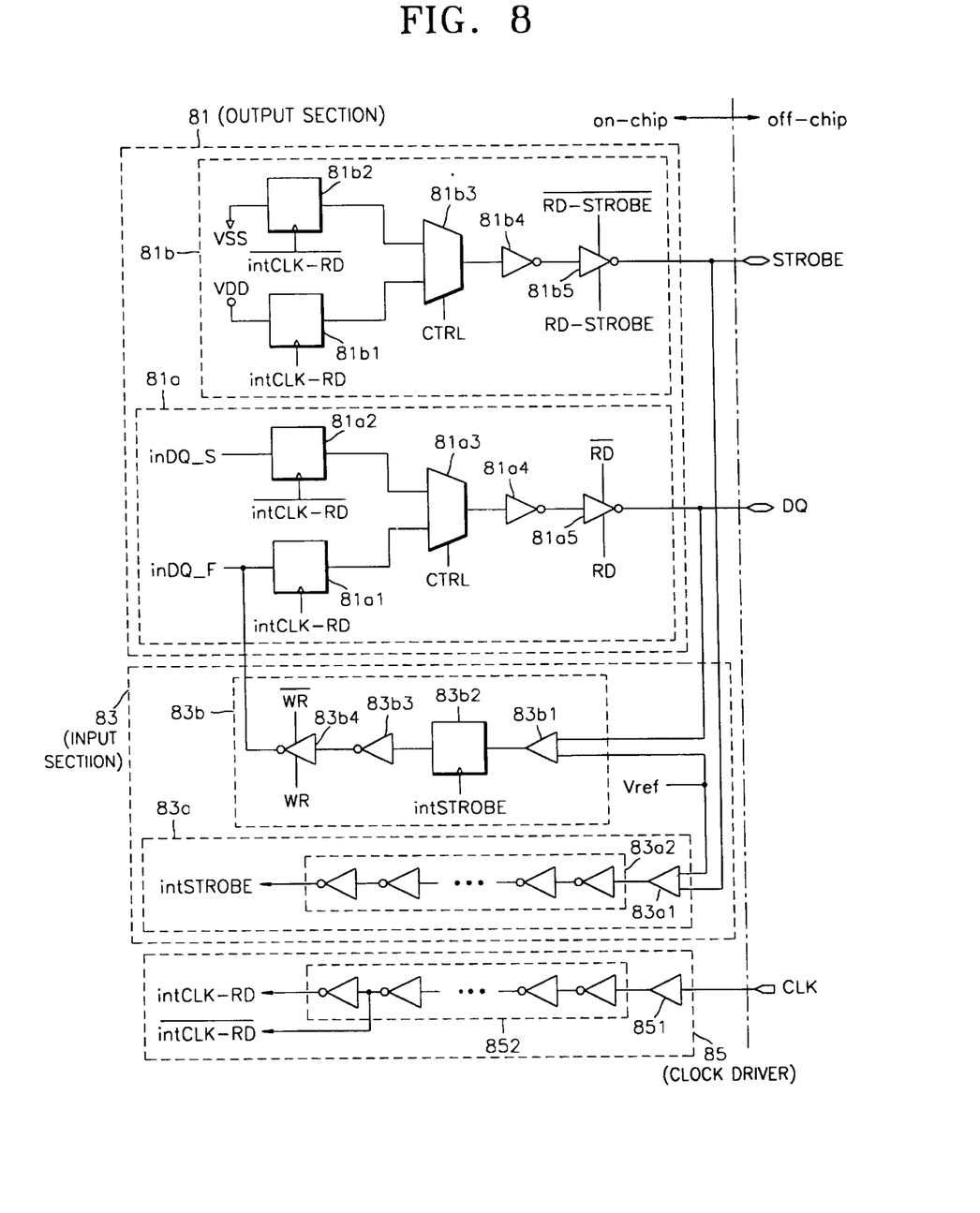
FIG. 8 illustrates a circuit diagram of an input/output circuit of the semiconductor memory device shown in FIG. 2.

FIG. 8 illustrates a circuit diagram of an input/output circuit of memory device 21 of FIG. 2. An input/output circuit of memory device 21 includes an output section 81, an input section 83, and a clock driver 85. Output section 81 has a same configuration as output section 71 shown in FIG. 7, and performs an identical operation. Input section 83 receives a write data signal through the input/output pin (DQ) at a predetermined one of a rising edge or a falling edge of STROBE inputted from the memory controller in a write operation. The clock driver 85 buffers the system clock CLK, and generates only intCLK-RD for a read operation.

The configuration and operation of each element of FIG. 8 will now be described in detail. Similar to output section 71 shown in FIG. 7, output section 81 includes a read data output section 81a and a strobe signal generator 81b. Since the read data output section 81a and the strobe signal generator 81*b* have the same configuration and operation as the read data output section 71*a* and the strobe signal generator 71*b* shown in FIG. 7, the detailed explanation will be omitted herein for simplicity.

Input section 83 includes a strobe signal input section 83*a* and a data input section 83*b*. Strobe signal input section 83*a* buffers STROBE inputted from the memory controller in a write operation, and generates an internal strobe signal (intSTROBE). Strobe signal input section 83*a* includes a strobe signal input buffer 83*a*1 and an internal strobe signal driver 83*a*2, which is comprised of an even number of serially-connected inverters. Data input section 83*b* receives a write data signal inputted through the input/output pin (DQ) at a predetermined one of a rising or a falling edge of intSTROBE. Data input section 83*b* includes an input buffer 83*b*1, a latch 83*b*2, an inverter 83*b*3, and a tri-state inverting buffer 83*b*4.

Clock driver 85 includes a clock buffer 851 and an internal clock driver 852. The clock buffer 851 buffers CLK, which is inputted externally. Internal clock driver 852 is comprised of an even number of serially-connected inverters, and generates the second internal clock (intCLK-RD) in response to the output signal of the clock buffer 851.

As described above, since a semiconductor memory device and a system using the semiconductor memory device according to the preferred embodiments of the present invention utilize the DDR method for read operation and the SDR method for write operation respectively, the semiconductor memory device can perform data sampling operation for the write data safely, without a phase synchronization device such as DLL or PLL.

Although clock, strobe, and data DQ lines have been discussed as being separate entities for the read and the write operations, it can be appreciated that a common set of clock, strobe, and data DQ conductors can be used for both the memory read and the memory write operations. Typically, other control lines can provide differentiation between these two operations in order to enable an appropriate functional set of operations and circuits.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for controlling a data transfer from a semiconductor memory device to a memory controller, comprising:

a) generating a strobe signal synchronized to both a first read data signal and a second read data signal;

b) outputting the first read data signal at a rising edge of the strobe signal in a first read operation;

c) sampling the first read data signal in the memory controller;

d) outputting the second read data signal at a falling edge of the strobe signal in a second read operation; and e) sampling the second read data signal in the memory controller;

wherein the synchronized strobe signal and the first and second data signals are transferred together via a same length data path to the memory controller in the first and second read operations, respectively.

2. The method according to claim 1, wherein the strobe signal is generated in only one of the semiconductor memory device and the memory controller.

3. A method for controlling a data transfer to a semiconductor memory device from a memory controller, comprising:

a) generating a strobe signal which is synchronized to a write data signal or a system clock signal;

b) simultaneously transmitting the strobe signal and the write data signal to the semiconductor memory device from the memory controller;

c) transferring the write data signal into the semiconductor memory device at only one of a rising edge and a falling edge of the strobe signal; and d) sampling the write data signal using a sampling means in the semiconductor memory device.

4. The method according to claim 3, wherein the strobe signal is generated in only one of the semiconductor memory device and the memory controller.

5. A method for controlling a data transfer to a semiconductor memory device from a memory controller, comprising:

a) generating a strobe signal which is synchronized to a write data signal and a system clock signal;

b) simultaneously transmitting the strobe signal and the write data signal to the semiconductor memory device from the memory controller;

c) transferring the write data signal into the semiconductor memory device at only one of a rising edge and a falling edge of the strobe signal; and d) sampling the write data signal using a sampling means in the semiconductor memory device.

6. The method according to claim 5, wherein the strobe signal is generated in only one of the semiconductor memory device and the memory controller.

* * * * *